(12) United States Patent
Inoue

(10) Patent No.: US 6,841,467 B2
(45) Date of Patent: Jan. 11, 2005

(54) METHOD FOR PRODUCING SEMICONDUCTOR DEVICE

(75) Inventor: Yushi Inoue, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/826,833

(22) Filed: Apr. 6, 2001

(65) Prior Publication Data

US 2001/0034120 A1 Oct. 25, 2001

(30) Foreign Application Priority Data

Apr. 25, 2000 (JP) .......................................... 2000-124324

(51) Int. Cl.⁷ .......................................... H01L 21/4763
(52) U.S. Cl. ...................................... 438/623; 438/634
(58) Field of Search ................................ 438/584, 598, 438/618, 622, 623, 624, 626, 634, 637, 638, 725, FOR 355, FOR 489, 925; 257/758–760

(56) References Cited

U.S. PATENT DOCUMENTS

| | | | | |
|---|---|---|---|---|
| 6,037,213 A | * | 3/2000 | Shih et al. | 438/253 |
| 6,100,184 A | * | 8/2000 | Zhao et al. | 438/622 |
| 6,114,233 A | * | 9/2000 | Yeh | 438/622 |
| 6,143,640 A | * | 11/2000 | Cronin et al. | 438/618 |
| 6,235,628 B1 | * | 5/2001 | Wang et al. | 438/622 |
| 6,268,283 B1 | * | 7/2001 | Huang | 438/622 |
| 6,291,887 B1 | * | 9/2001 | Wang et al. | 257/751 |
| 6,316,351 B1 | * | 11/2001 | Chen et al. | 438/638 |
| 6,331,479 B1 | * | 12/2001 | Li et al. | 438/618 |
| 6,358,842 B1 | * | 3/2002 | Zhou et al. | 438/596 |

FOREIGN PATENT DOCUMENTS

| | | |
|---|---|---|
| JP | 10-112503 | 4/1998 |
| JP | 11-186391 | 7/1999 |
| JP | 2001-102447 | 4/2001 |
| JP | 2001-230316 | 8/2001 |

* cited by examiner

*Primary Examiner*—George Fourson
*Assistant Examiner*—Brook Kebede
(74) *Attorney, Agent, or Firm*—Nixon & Vanderhye P.C.

(57) ABSTRACT

A method for producing a semiconductor device comprises forming an opening by etching process using a resist pattern as a mask in a multi-layered film having a first organic insulating film, a first etching stop film and a second organic insulating film being layered in this order such that the opening penetrates from the first organic insulating film to the second organic insulating film, wherein a second etching stop film is formed between the resist pattern and the second organic insulating film to protect the second organic insulating film from being etched during the formation of the opening.

12 Claims, 3 Drawing Sheets

METHOD FOR PRODUCING SEMICONDUCTOR DEVICE

CROSS-REFERENCES TO RELATED APPLICATION

This application is related to Japanese Patent Application No. 2000-124324, filed on Apr. 25, 2000 whose priority is claimed under 35 USC § 119, the disclosures of which are incorporated by reference in their entirety.

BACKGROUND OF THE INVENTION

1. Field of the Invention

The present invention relates to a method for producing a semiconductor device, and in further detail, it relates to a method for producing a semiconductor device by means of dual damascene process, the device having a multi-layered interconnection structure comprising an organic insulating film, particularly an organic insulating film having a low dielectric constant.

2. Prior Art

With the recent tendency in producing semiconductor devices having finer patterns and multi-layered structure, interconnection delay is found as a serious problem.

More specifically, finer transistors have been implemented thus far in accordance with the scaling law for realizing higher device operation performance. On the other hand, however, this approach has increased the interconnection resistance and the interconnection capacitance, and the interconnection delay expressed by RC is no longer negligible with respect to the operation speed of LSI.

Finer patterns have also increased the current density in the interconnection, and a drop in reliability of the interconnection ascribed to the electromigration as well as an increase in power consumption due to the increase in interconnection capacity is also a severe problem to be overcome.

In order to overcome the aforementioned problems, Cu is being used for the interconnection because it has a lower resistance and a higher electromigration resistance than Al. However, Cu is disadvantageous in that it cannot be processed by a conventional dry etching technique. Accordingly, the application of damascene process using CMP (chemical mechanical polishing) method is widely studied. In particular, a dual damascene process, i.e., a process comprising forming the interconnection and a buried plug of the via holes at the same time, has been recently developed.

For instance, the unexamined published Japanese patent application Hei11(1999)-186391 is proposed a method for producing a semiconductor by employing a dual damascene process as follows.

Firstly, as shown in FIG. 2(a), a first etching stop film 31, a second interlayer insulating film 22, a second etching stop film 32, and a third interlayer insulating film 23 are sequentially formed in this order on a first interlayer insulating film 21 having partially formed therein a buried metallic interconnection 14.

Subsequently, referring to FIG. 2(b), a resist pattern 15 for forming a via hole is formed on the third interlayer insulating film 23, and the second etching stop film 32 as well as the third interlayer insulating film 23 are etched by using the resist pattern 15 as a mask, under etching conditions as such that the etching rate may be the same for the second etching stop film 32 and the third interlayer insulating film 23. At the point etching reaches the second interlayer insulating film 22, the second interlayer insulating film 22 is etched by using the resist pattern 15 as a mask again under the etching conditions as such that the etching rate of the etching stop film 31 should be sufficiently lower than that of the second interlayer insulating film 22.

Then, referring to FIG. 2(c), the first etching stop film 31 that is provided under the second interlayer insulating film 22 is removed by etching, still using the resist pattern 15 as a mask, by changing the etching conditions. A via hole 16 can be formed in this manner.

After stripping off the resist pattern 15, as shown in FIG. 2(d), a resist pattern 17 for forming an interconnection groove is formed on the third interlayer insulating film 23, and the third interlayer insulating film 23 is etched by using the resist pattern 17 as a mask under the etching conditions as such that the etching rate of the second etching stop film 32 should become sufficiently lower than that of the third interlayer insulating film 23. Thus is formed the interconnection groove 18 connected to the first metallic interconnection 14 through the via hole 16.

Subsequently, a metallic film is formed on the entire surface as such that the via hole 16 and the interconnection groove should be completely buried. Then, referring to FIG. 2(e), the metallic film that is provided on the third interlayer insulating film 23 is removed by CMP process to form the metallic interconnection and the connecting plug 19 monolithically inside the interconnection groove 18 and the via hole 16, respectively.

In the process above, however, the via hole 16 is opened after directly forming the resist patterns 15 and 17 on the third interlayer insulating film 23. Thus, in case an organic insulating film having low dielectric constant, which is frequently used in the art to reduce the interconnection capacity, is used for the third interlayer insulating film 23, there occurs a problem that the organic insulating film is also etched on opening the via hole.

More specifically, in the case where a via hole is formed through two or more layers of organic insulating film, i.e., through the third and the second interlayer insulating films, the resist pattern also is gradually etched because the etching rate of the organic insulating film is approximate the same as that of the resist, and the resist pattern suffers thinning gradually as to expose the surface of the third interlayer insulating film. This leads to a problem of causing etching of the third interlayer insulating film before the completion of forming the via hole.

In order to prevent the aforementioned problem from occurring, the resist pattern should be provided sufficiently thick as such not thinner than the film thickness corresponding to the total thickness of the second interlayer insulating film 22 and the third interlayer insulating film 23. However, if the resist pattern is provided too thick, an abnormal pattern formation occurs at the exposure as to cause a novel problem of making incomplete patterning on providing a patterning of a predetermined shape (e.g., in the case of patterning 0.12 μm wide patterns, the upper limit of the resist thickness is about 500 nm).

In the unexamined published Japanese patent application Hei10(1998)-112503 is proposed a technology as follows.

Referring to FIG. 3(a), on a silicon substrate 40 are provided a silicon oxide film 41, an organic insulating film 42 having a low dielectric constant, a silicon oxide film 43 and a resist pattern 44 for forming the interconnection pattern in this order.

Then, as shown in FIG. 3(b), an opening 45 corresponding to an interconnection pattern is provided by dry etching the silicon oxide 43 using the resist pattern 44 as a mask. The resist pattern 44 is removed thereafter.

Referring to FIG. 3(c), subsequently, a resist pattern 46 for forming via holes is formed on the silicon oxide film 43 and the organic insulating film 42 having a low dielectric constant by means of photolithography and etching technique.

Referring to FIG. 3(d), the organic insulating film 42 having a low dielectric constant and the silicon oxide film 41 provided below the opening 45 of the silicon oxide film 43 are selectively and sequentially etched by means of dry etching using the resist pattern 46 as a mask, to thereby providing a via hole 47. The resist pattern 46 is removed thereafter.

Then, referring to FIG. 3(e), an interconnection groove 48 is formed by etching the organic insulating film 42 having a low dielectric constant using the silicon oxide film 43 as a mask, and as shown in FIG. 3(f), an interconnection material is buried in the via hole 47 and the interconnection groove 48 as to establish an interconnection 49.

In accordance with the process above, the via hole 47 is formed by etching using the resist pattern 46 as a mask. In this case, however, the organic insulating film is provided as a single layer. Hence, there is no problem of suffering film thinning and a complete removal of the resist pattern during opening a via hole.

However, to suppress an increase in the interconnection capacity of the resulting semiconductor device, it is desired to use an organic insulating film having a low dielectric constant instead of a silicon oxide film. On the other hand, if an organic insulating film having a low dielectric constant is used in the place of the silicon oxide film 41, the total thickness for the two layers of organic insulating film having a low dielectric constant exceeds the total thickness of the resist pattern 46. Thus, in this case again, there occurs a problem that the surface of the organic insulating film 42 having a low dielectric constant suffers etching.

SUMMARY OF THE INVENTION

The present invention has been made in order to overcome the aforementioned problems, and an object of the present invention is to provide a method for producing a semiconductor device by applying a dual damascene process using an organic insulating film, the method capable of forming a via hole and an interconnection groove even in the case there should occur a thinning of the resist pattern used as a mask without generating film thinning of the interlayer insulating film provided below the resist pattern.

The present invention provides a method for producing a semiconductor device comprising;

forming an opening by etching process using a resist pattern as a mask in a multi-layered film having a first organic insulating film, a first etching stop film and a second organic insulating film being layered in this order such that the opening penetrates from the second organic insulating film to the first organic insulating film, wherein a second etching stop film is formed between the resist pattern and the second organic insulating film to protect the second organic insulating film from being etched during the formation of the opening.

DESCRIPTION OF THE PREFERRED EMBODIMENTS

Figure 1A:
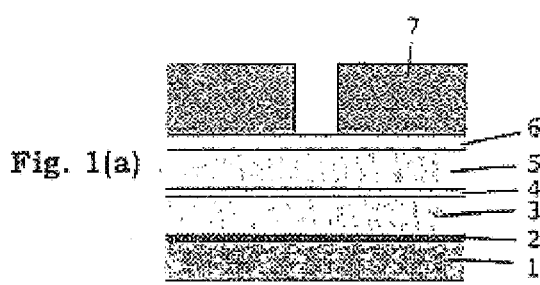
FIG. 1(a) to FIG. 1(j) are each cross section views of the essential portions provided as an explanatory diagram to show an embodiment according to the method for producing a semiconductor device according to the present invention.

The method for producing a semiconductor device according to the present invention mainly comprises forming an opening such as a via hole, an interconnection groove, etc., by means of dual damascene process in the case of forming a multi-layered interconnection structure having a multi-layered structure comprising a first organic insulating film, a first etching stop film and a second etching stop film being formed in this order.

In the method for producing a semiconductor device according to the present invention, the multi-layered film is preferably formed on a semiconductor substrate. As a semiconductor substrate for use in the present invention, specifically mentioned are those made of a semiconductor generally used in forming a semiconductor device, such as an elementary semiconductor, e.g., silicon, germanium, etc., as well as a compound semiconductor such as GaAs, InGaAs, ZnSe, etc. Among them silicon may be preferred. The semiconductor substrate contains a so-called SOI structure or a multi-layered SOI structure. Furthermore, on the semiconductor substrate may be formed a device isolation film, elements such as transistors, capacitors, resistors, etc., a circuit, an insulating film, an interconnection layer, a dummy interconnection layer, etc., which may be provided independently or in combination thereof as desired, either below the multi-layered film or in any other region. For instance, a first organic insulating film may be formed on a semiconductor substrate having provided thereon an electrode of a transistor or a capacitor, or an interconnection layer connecting them as the lower interconnection, with another etching stop film optionally provided interposed there between. In the case of providing another etching stop film below the first organic insulating film, it is preferred that the etching stop film functions not only as an insulating film, but also as a diffusion barrier for metallic elements or impurities such as copper, phosphorus, arsenic, boron, etc. Specifically are mentioned silicon nitride films, silicon carbide films, etc.

As the first organic insulating film constituting the lowermost layer of the multi-layered film, there can be used any type of a film made of an organic material which provides an insulating function. Specific examples thereof include, for instance, a single layer or a multi-layered film of polytetrafluoroethylene, fluorinated polyallyl ether, fluorinated polyimide, etc. Also included therein are those having a dielectric constant of about 3 or lower. Particularly preferred among them are those having a low dielectric constant, such as those having a dielectric constant of about 1.8 or lower. Specifically mentioned as the first organic insulating film are single layered or multi-layered films of FLARE (trade name of a product produced by Allied Signal Inc.), SiLK (trade name of a product produced by The Dow Chemical Company), etc. The film thickness of the first organic insulating film may be properly selected depending on the material, the film thickness, etc., of the second organic insulating film and the first etching stop film which are to be described hereinafter, or on the function of the targeted semiconductor device. For instance the film thickness is preferably set as such corresponding to the height of the connection holes such as those denoted as via holes, contact holes, through holes, etc. as a total thickness with the first etching stop film to be described hereinafter. More specifically, the thickness of the first organic insulating film is set to about 50 to 100 nm.

There is no particular limitations on the first etching stop film formed on the first organic insulating film, so long as it functions as an etching stopper in the case where etching is performed under the etching process, the etching conditions described hereinafter to the second organic insulating film which is formed on the first etching stop film. However, the etching stop film preferably provides an insulating function. The term "function as an etching stopper" as referred herein signifies that the selectivity ratio with respect to the second organic insulating film (i.e., the ratio of the etching rate of the second organic insulating film to that of the first etching stop film) is sufficiently high. The selectivity ratio can be properly controlled by selecting the material, etc., of the second organic insulating film. There can be specifically mentioned a value of about 5 or higher, or about 10 or higher, preferably about 15 or higher, and more preferably about 20 or higher.

As a material constituting the first etching stop film, there can be specifically mentioned a single layer or a multi-layered films made of silicon oxide, silicon nitride, BPSG (boron phosphosilicate glass), PSG (phosphosilicate glass), BSG (borosilicate glass), AsSG (arsenosilicate glass), etc. Particularly preferred among them is a silicon oxide film. The film thickness of the first etching stop film is not particularly limited, but specifically mentioned is a thickness in the range of about 50 to 100 nm. In the case of using a silicon oxide film, in particular, a film can be obtained stably at a thickness of about 50 nm. In the case where the film is provided thicker than those having a film thickness of about 100 nm, the resulting semiconductor device may suffer a large interconnection capacity attributed to the relatively high dielectric constant.

The second organic insulating film that is formed on the first etching stop film may be such made of a material properly selected from those specifically mentioned for the first organic insulating film. Particularly preferred is to use the same material as that used in the first organic insulating film. The film thickness of the second organic insulating film may be properly controlled depending on the material, the film thickness, etc., of the first organic insulating film and the first etching stop film, or on the function and the like of the targeted semiconductor device. Specifically mentioned as the film thickness for the second organic insulating film is in the range of about 300 to 1,000 nm.

The resist pattern may be formed with any material so long it is used as a resist in an ordinary photolithography process, and there can be used positive type and negative type resists. For instance, there can be mentioned a novolak-naphthoquinonediazide based resist, a cyclized rubber-bisazide based resist, a chemically sensitized resist, etc. Since the resist pattern is used as a mask on etching the first etching stop film, the second etching stop film, the first organic insulating film and/or the second organic insulating film, the selectivity ratio with respect to these films (i.e., the ratio of the etching rate of the resist pattern to that of these films) should be sufficiently small. Although the selectivity ratio differs depending on the material constituting the resist pattern, the materials constituting these films, the etching method, etching conditions, etc., preferred is to have a value of 1 or smaller.

The resist pattern may be provided in a variety of shapes corresponding to the shape of the connection holes such as those so-called as via holes, contact holes, through holes, etc., or a shape of the opening corresponding to that of the interconnection and the like.

As the thickness of the resist pattern, there is no particular limitation so long as it is capable of providing a proper pattern shape by means of an ordinary photolithography and etching process, and specifically mentioned in the case of forming a pattern of an interconnection width (e.g., a 0.12 μm width) for performing dual damascene process is about 500 nm or less, more specifically, a width in a range of from about 200 to 500 nm.

In the case of forming a plurality of openings differing in shape in accordance with the method of the present invention, there may be used a plurality of resist patterns. For instance, in case of forming a connection hole penetrating the first and the second organic insulating films and the first and the second etching stop films, a resist pattern having an opening corresponding to the shape of the connection hole is formed at first, and then, in the case of forming an interconnection groove on the second organic insulating film and the second etching stop film, there may be formed a resist pattern having an opening corresponding to the interconnection groove. The resist patterns for the connection holes or the interconnection grooves may be formed in an order reversed to above.

The second etching stop film that is formed between the resist pattern and the second organic insulating film is formed of such a material in such a film thickness that the second organic insulating film is protected from being etched when an opening is formed through the second organic insulating film to the first organic insulating film by etching using the resist pattern.

Further, since an opening should be provided on the second etching stop film by using the resist pattern above as a mask, it is preferred that the selectivity ratio with respect to the resist pattern (i.e., the ratio of the etching rate of the second etching stop film to that of the resist pattern) is sufficiently high in the case where etching is performed under a proper etching process and a proper etching conditions As the proper etching process usable in this process, there can be mentioned an wet etching process using an acid or an alkaline solution, or a mixed solution thereof; and a dry etching process such as vapor phase etching, plasma etching, RIE (reactive ion etching), sputter etching, ion beam etching, photoetching, etc., particularly preferred among them are vapor phase etching, plasma etching, etc.

The etching conditions in the case of performing wet etching refer to the type of the solution used in the process, the temperature, the method of contacting the solution, the time duration of contact, etc. In the case of dry etching, the conditions refer to the type of the etching apparatus, the type or the combination of the gases used as the etchant, the flow rate of the gases, power, pressure, etc.

A high selectivity ratio signifies that the ratio yields a value of about 5 or higher, or about 10 or higher, preferably about 15 or higher, and more preferably, about 20 or higher.

As the material usable for the second etching stop film, there can be mentioned, for instance, those properly selected from the materials enumerated above for the first etching stop film. Particularly preferred is to select the same material used for the first etching stop film, because there are advantages as such that the apparatus for depositing the first etching stop film can be used as it is, and that the selectivity ratio of the first etching stop film can be applied unchanged. The film thickness of the second etching stop film may be properly controlled depending on the material, the film thickness, etc., of the first and the second organic insulating films as well as those of the first etching stop film, or on the function and the like of the targeted semiconductor device. However, preferred is that the second etching stop film is provided thicker than the first etching stop film. Specifically mentioned as the film thickness for the second etching stop film is from about 250 to 500 nm.

A mode of practicing the method for producing a semiconductor device according to an embodiment of the present invention is described below by making reference to the attached drawings.

Referring to FIG. 1(a), on a lower interconnection layer 1 are provided, in the following order, an etching stop film about 10 to 100 nm in film thickness, e.g., a silicon nitride film 2 about 50 nm in thickness; a first organic polymer insulating film 3, e.g., a FLARE film about 500 nm in thickness; a first etching stop film 4, e.g., a silicon oxide film about 100 nm in thickness; a second organic polymer insulating film 5, e.g., a FLARE film about 500 nm in thickness; a second etching stop film 6 about 300 nm in thickness; and a resist pattern 7 for forming a via hole, about 500 nm in thickness. The silicon nitride film 2 on the lower interconnection layer 1 also serves as a diffusion barrier film for Cu.

Figure 1F:
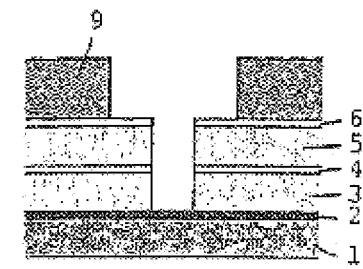
Figure 1B:
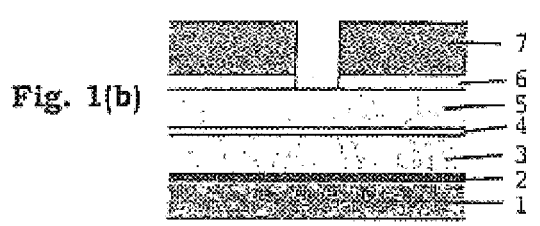

Then, as shown in FIG. 1(b), the second etching stop film 6 is etched by using the resist pattern 7 as a mask. The etching was performed under conditions as follows:

Gas flow rates: $C_4F_8$ 10 to 15 sccm,
CO 80 to 100 sccm,
$O_2$ 2 to 5 sccm,
Ar 50 to 70 sccm,
Power: 1,500 to 1,700 W; and
Pressure: 50 to 60 mTorr.

The selectivity ratio (the ratio of the etching rate for the second etching stop film 6 to that of the resist pattern 7) in this case was found to be 3.

Subsequently, the second organic polymer insulating film 5 is etched by using the resist pattern 7 as a mask under the etching conditions as such that first etching stop film 4 would be hardly etched as compared with the second organic polymer insulating film 5. The etching was performed under conditions as follows:

Gas flow rates: $CH_3F$ 30 to 40 sccm,
$O_2$ 35 to 45 sccm,
$N_2$ 15 to 25 sccm,
Power: 400 to 500 W; and
Pressure: 40 to 50 mTorr. In this case, as is shown in FIG. 1(c), the resist pattern 7 also undergoes etching gradually at a selectivity ratio of (the second organic polymer insulating film 5 to the resist pattern 7) 0.8 during the etching of the second organic polymer insulating film 5. Since the selectivity ratio of the second organic polymer insulating film 5 to the first etching stop film 4 is 20, etching is almost completely stopped at the first etching stop film 4.

Figure 1G:
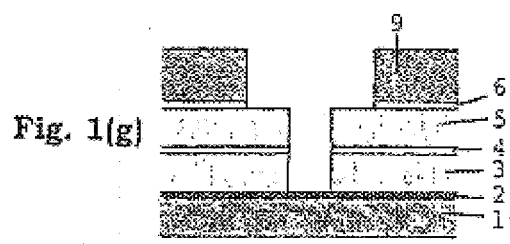
Figure 1C:
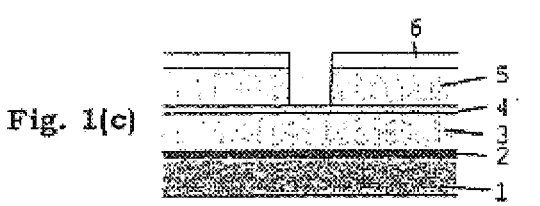
Figure 1H:
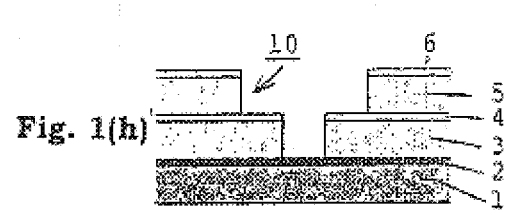
Figure 1D:
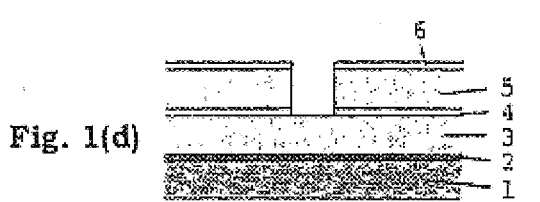

Then, referring to FIG. 1(d), the first etching stop film 4 is etched by using the second etching stop film 6 as a mask. The etching conditions used in this step were similar to those employed in the step with reference to FIG. 1(b). In this etching step, the second etching stop film 6 is etched together with the first etching stop film 4. Thus, the second etching stop film 6 undergoes thinning, but is not completely removed.

Figure 1I:
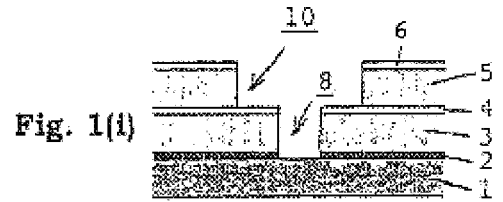
Figure 1E:
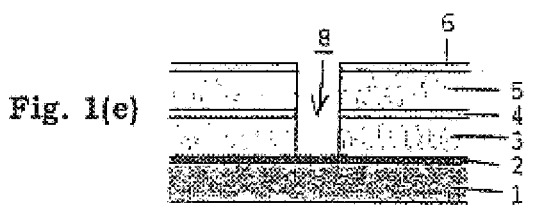

Referring to FIG. 1(e), the first organic polymer insulating film 3 is etched by using the second etching stop film 6 as a mask under the etching conditions as such that the etching stop film 2 would be hardly etched as compared with the first organic polymer insulating film 3. The etching conditions used in this step were similar to those employed in the step with reference to FIG. 1(c). The etching can be stopped almost completely at the etching stop film 2. The connection hole 8 is formed in this manner.

Then, as is shown in FIG. 1(f), a resist pattern 9 for forming the interconnection groove is provided on the second etching stop film 6 at a thickness of about 500 nm.

Referring to FIG. 1(g), the second etching stop film 6 is etched by using the resist pattern 9 as a mask under the etching conditions as such that the etching rate for the etching stop film 2 should become sufficiently slower as compared with that of the second etching stop film 6.

Sequentially, the second organic polymer insulating film 5 is etched by using the resist pattern 9 as a mask under the etching conditions as such that the first etching stop film 4 and the etching stop film 2 would be hardly etched as compared with the second organic polymer insulating film 5. The etching conditions used in this step were similar to those employed in the step with reference to FIG. 1(c). In this etching step, as is shown in FIG. 1(h), the resist pattern 9 is gradually etched together with the etching of the second organic polymer insulating film 5, but the etching can be stopped at the first and the second etching stop films 4 and 6, and the lower interconnection layer 1 provided under the connection hole 8 is maintained without being exposed. The interconnection groove 10 is formed in this manner.

Figure 1J:
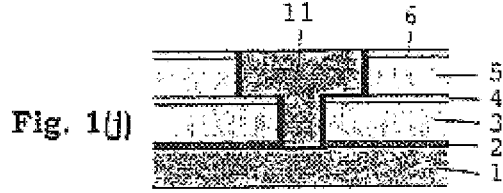
Figure 2A:
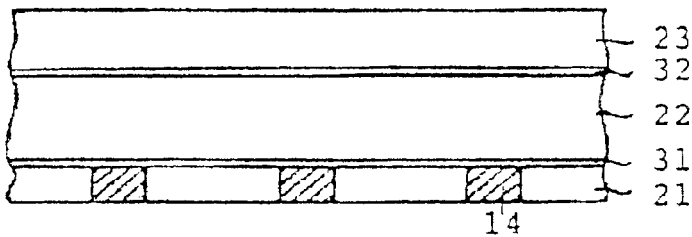
FIG. 2(a) to FIG. 2(e) are each cross section views of the essential portions provided as an explanatory diagram to show schematically a prior art dual damascene process; and FIG. 3(a) to FIG. 3(f) is each cross section views of the essential portions provided as an explanatory diagram to show schematically another prior art dual damascene process.
Figure 2B:
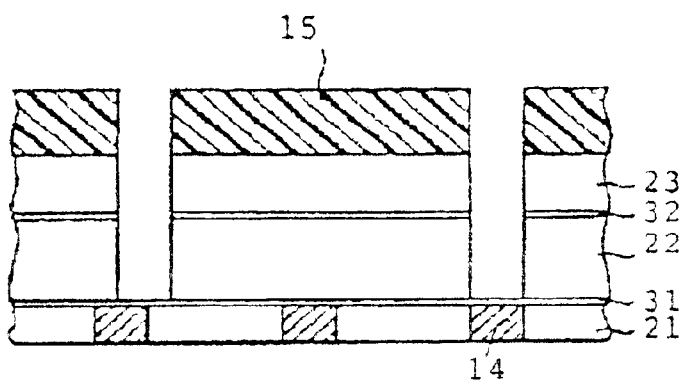
Figure 2C:
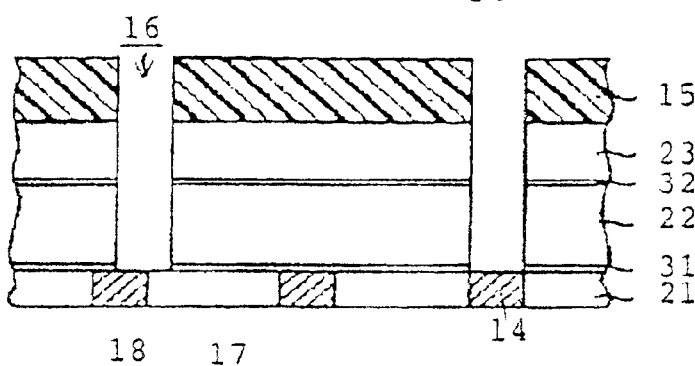
Figure 2D:
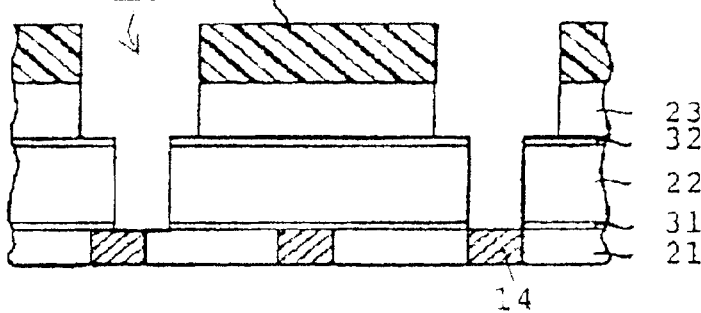
Figure 2E:
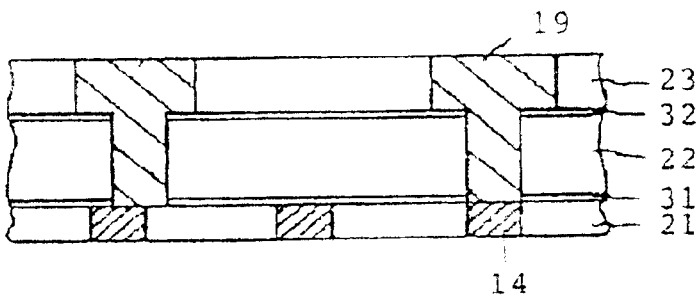
Figure 3A:
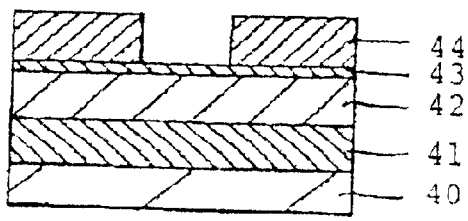
Figure 3B:
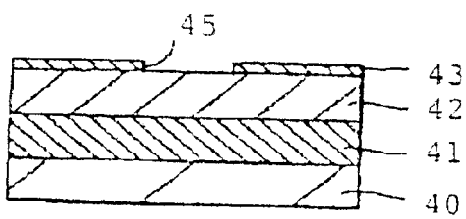
Figure 3C:
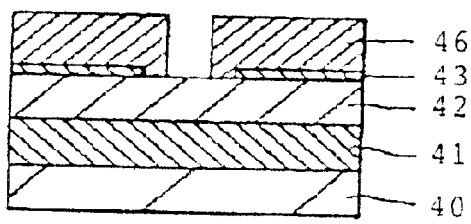
Figure 3D:
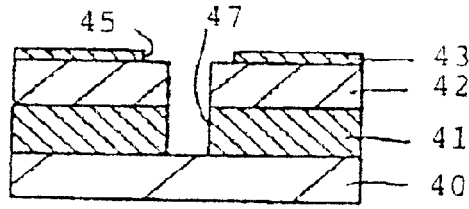
Figure 3E:
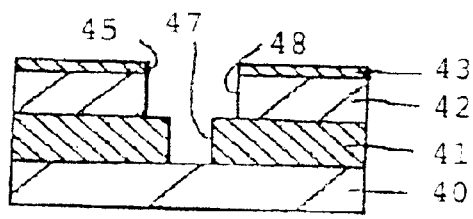
Figure 3F:
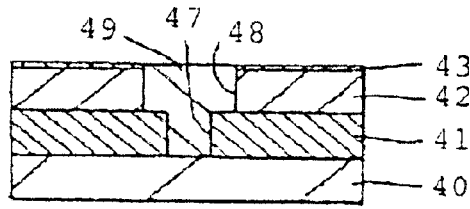

Referring to FIG. 1(i), the etching stop film 2 is etched by using the second and the first etching stop films 6 and 4 as masks to thereby expose the lower interconnection layer 1 provided under the connection hole 8. The etching was performed under conditions as follows:

Gas flow rates: $CH_3F$ 5 to 10 sccm,
$O_2$ 45 to 55 sccm,
Power: 200 to 300 W; and
Pressure: 40 to 50 mTorr. Then, after forming a metallic film in such a manner that the inside of the connection hole 8 and the interconnection groove 10 should be completely buried, as is shown in FIG. 1(j), the metallic film that is present on the second etching stop film 6 is removed by means of CMP method to form an interconnection 11. In this case, the second etching stop film 6 also functions as an etching stopper on removing the metallic film. The second etching stop film 6 is removed for about 100 nm by the CMP process.

According to the production method of the present invention, a second etching stop film is interposed between the resist pattern and the second organic insulating film in such a manner to protect the second organic insulating film from being etched during the formation of the opening. Hence, in the case where a organic insulating film is applied in a dual damascene process, even in the case where the resist pattern should suffer thinning or complete removal by etching, the surface of the second organic insulating film can be prevented from being etched by simply providing a second etching stop film.

Thus, even in the case of forming a plurality of openings differing in shape, e.g., connection holes and interconnection grooves, should be formed, these openings can be formed continuously by forming the corresponding resist patterns only once. Hence, the production process can be simplified and the production cost can be decreased. At the same time, the interconnection capacity can be reduced and the insulating film can be maintained thick as to implement a semiconductor device of high reliability.

In particular, in the case where the first and second etching stop films are provided with the same material, a film deposition apparatus can be used in common for the formation of stop films, and this further reduces the production cost.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A method for producing a semiconductor device comprising:

forming a resist pattern to be used as a mask over a multi-layered film, wherein the multi-layered film includes a nitride etching stop film, a first organic insulating film, a first oxide etching stop film, a second organic insulating film, and a second oxide etching stop film layered in this order so that the second oxide etching stop film is formed between the resist pattern and the second organic insulating film to protect the second organic insulating film, wherein the nitride etching stop film and the first and second oxide etching stop films are all provided as continuous layers with no apertures defined therein when the resist pattern is formed over the multi-layered film, forming an opening by an etching process using the resist pattern as a mask during at least a part of forming the opening, wherein the opening penetrates at least the first and second organic insulating films and is of substantially the same size in both the first and second organic insulating films, and wherein the second oxide etching stop film is used as a mask when forming the opening in the first organic insulating film so that the second oxide etching stop film is thinned but is not completely removed during the forming of the opening in the first organic insulating film.

2. A method for producing a semiconductor device as claimed in claim 1, wherein the first organic insulating film has a dielectric constant of about 3 or lower.

3. A method for producing a semiconductor device as claimed in claim 1, wherein the first organic insulating film includes a single layer or a multi-layered film of polytetrafluoroethylene, fluorinated polyallyl ether or fluorinated polyimide.

4. A method for producing a semiconductor device as claimed in claim 3, wherein the second etching stop film is made from the same material as the first etching stop film.

5. A method for producing a semiconductor device as claimed in claim 1, wherein the first etching stop film is a film that functions as an etching stopper to the first organic insulating film and has an insulating function.

6. A method for producing a semiconductor device as claimed in claim 5, wherein the first etching stop film has a selectivity ratio with respect to the second organic insulating film of 5 or higher.

7. A method for producing a semiconductor device as claimed in claim 1, wherein the second etching stop film is formed of such a material in such a film thickness that the second organic insulating film is protected from being etched when an opening is formed through the second organic insulating film to the first organic insulating film.

8. A method for producing a semiconductor device as claimed in claim 1, wherein another etching stop film which is functioned as a diffusion barrier for metallic elements or impurities is provided under the multi-layered film.

9. The method of claim 1, wherein another resist is used as a mask in enlarging the opening in the second organic insulating film but not the first organic insulating film.

10. The method of claim 1, wherein the second etching stop film is thicker than the first etching stop film immediately after the first and second etching stop films are deposited, so that during said forming of the opening in the first organic insulating film the first etching stop film is penetrated and removed in an area of the opening but the second etching stop film is thinned but is not completely removed during said forming of the opening in the first organic insulating film.

11. A method for producing a semiconductor device, the method comprising:

forming a resist pattern to be used as a mask over a multi-layered film, wherein the multi-layered film includes a nitride inclusive etching stop film, a first organic insulating film, a first etching stop film, a second organic insulating film, and a second etching stop film layered in this order so that the second etching stop film is formed between the resist pattern and the second organic insulating film to protect the second organic insulating film, wherein the nitride inclusive etching stop film and the first and second etching stop films are all provided as continuous layers with no apertures defined therein when the resist pattern is originally formed over the multi-layered film, forming an opening by an etching process using the resist pattern as a mask during at least a part of forming the opening, wherein the opening penetrates at least the first and second organic insulating films and is of substantially the same size in both the first and second organic insulating films, and wherein the second etching stop film is used as a mask when forming the opening in the first organic insulating film so that the second etching stop film is thinned but is not completely removed during the forming of the opening in the first organic insulating film.

12. The method of claim 11, wherein the second etching stop film is thicker than the first etching stop film immediately after the first and second etching stop films are deposited, so that during said forming of the opening in the first organic insulating film the first etching stop film is penetrated and removed in an area of the opening but the second etching stop film is thinned but is not completely removed during said forming of the opening in the first organic insulating film.

* * * * *